(12) United States Patent
Hsueh et al.

(10) Patent No.: US 7,802,169 B2
(45) Date of Patent: Sep. 21, 2010

(54) ERROR CORRECTION DEVICES AND CORRECTION METHODS

(75) Inventors: Ching-Wen Hsueh, Luodong Township, Yilan County (TW); Li-Lien Lin, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 697 days.

(21) Appl. No.: 11/299,537

(22) Filed: Dec. 12, 2005

(65) Prior Publication Data

US 2007/0136645 A1    Jun. 14, 2007

(51) Int. Cl.
*H03M 13/00* (2006.01)

(52) U.S. Cl. .................. 714/784; 714/756; 714/769

(58) Field of Classification Search .................. 714/784, 714/756, 769
See application file for complete search history.

(56) References Cited

U.S. PATENT DOCUMENTS

| | | | |
|---|---|---|---|
| 6,161,208 A | 12/2000 | Dutton et al. | |
| 6,434,081 B1 | 8/2002 | Johnson et al. | |
| 6,499,082 B1 * | 12/2002 | Lin et al. | 711/112 |
| 6,584,595 B2 | 6/2003 | Cypher | |
| 6,851,081 B2 | 2/2005 | Yamamoto | |
| 6,859,904 B2 | 2/2005 | Kocol et al. | |
| 7,509,558 B2 * | 3/2009 | Muller et al. | 714/756 |
| 2002/0191967 A1 * | 12/2002 | Freissmann et al. | 386/124 |

FOREIGN PATENT DOCUMENTS

| | | |
|---|---|---|
| CN | 1409856 | 4/2003 |
| WO | 0145101 | 6/2001 |
| WO | 2005006563 A1 | 1/2005 |

OTHER PUBLICATIONS

CN Office Action mailed Oct. 31, 2008.
English abstract of CN1409856.
China Office Action mailed Apr. 10, 2009.

* cited by examiner

*Primary Examiner*—Sam Rizk
(74) *Attorney, Agent, or Firm*—Thomas, Kayden, Horstemeyer & Risley

(57) ABSTRACT

An error correction device is provided. When an error of a data group stored in a dynamic random access memory (DRAM) device is detected, a memory controller of the error correction device executes a burst read and write, burst write or burst read-modify-write (RMW) operations to the DRAM instead of the conventional single read-modify-write (RMW) operation, thereby reducing the occupied bandwidth of the DRAM.

24 Claims, 8 Drawing Sheets

ERROR CORRECTION DEVICES AND CORRECTION METHODS

BACKGROUND

The invention relates to error correction devices, and in particular to methods for correcting errors by burst read and write, burst write or burst read-modify-write (RMW) operations.

When a data error stored in a dynamic random access memory (DRAM) device is detected, the data is corrected with a read-modify-write (RMW) operation. A conventional RMW operation is applied in such a manner that data is read out using an RMW function of the DRAM. The read data is then modified by an external circuit. The modified data is finally restored in the corresponding memory cell within the DRAM. The conventional RMW operation requires a relatively long processing time defined by the operating cycle of the DRAM, however resulting in inconvenience and performance degradation.

FIG. 1 shows a conventional scheme of an error correction device 1. The error correction device 1 comprises a decoder 10, a memory controller 11, and a dynamic random access memory (DRAM) 12. The DRAM stores a plurality of bytes of data. The error correction device 1 performs an RMW operation as each byte of data stored in the DRAM 12 is modified. The decoder 10 receives error correction codes (ECCs) and decodes a plurality of error values according to the ECCs. FIG. 2 depicts commands of the memory controller 11 in RMW operations, wherein the label "20" represents the commands of the memory controller 11, the label "21" represents reading/writing data on a DRAM bus, and the label "22" represents the error values. Referring FIGS. 1 and 2, one example of the correction of one byte of data D1 will be described. The memory controller 11 sends a pre-charge command (PRE) and an active command (ACT) to the DRAM 12, so that an address of the data D1 to be modified in the DRAM 12 is located. When the memory controller 11 then sends a read command (RD) to the DRAM 12, the DRAM 12 transmits the data D1 to a computing unit 13 in the memory controller 11 through the DRAM bus. The computing unit 13 also receives the error values from the decoder 10. The computing unit 13 performs a logic operation for the data D1 and the corresponding error value E1 to modify the data. When the memory controller 11 sends a write command (WR) to the DRAM 12, the modified data W1 is transmitted to the DRAM 12 from the computing unit 13 and restored in the corresponding address. Therefore, according to the conventional error correction device 1, the memory controller sends n pre-charge commands (PREs), n active commands (ACTs), n read commands, and n write commands for n bytes of data to be modified.

In FIG. 2, the memory controller sends no-operation commands (NOPs) between the pre-charge command (PRE) and the active command (ACT), between the active command (ACT) and the read command (RD), and between the read command (RD) wand the write command (WR). These no-operation commands (NOPs) prevent unwanted commands during idle or wait states. The label "$P_{RMW}$" represent the duration of one RMW operation. The label "Trp20" represents the delay from the pre-charge command (PRE) to the active command (ACT), the label "Trcd20" represents the delay from the active command (ACT) to the read command (RD), the label "Trcl20" represents the delay from the read command (RD) to the time when the data D1 on the DRAM bus. Referring to FIG. 2, in one RMW operation, the error correction device 1 requires (Trp20+Trcd20+Tcl20+1(NOP23)+1(WR)) cycles. "NOP23" is inserted to prevent DRAM Bus contention. It is assumed that each of the delays Trp20, Trcd20, and Trcl20 consumes 3 cycles, thus 11 cycles will be consumed when one byte of data is modified. A cluster of a blue-ray disc (BD) has 248*304 bytes, and it is assumed the error rate of a blue-ray disc is 5%. When the error correction device 1 is employed in a blue-ray disc, it will consume about 41459 cycles ((248*304*11*5%)=~41459). These cycle will degrade the DRAM bandwidth utilization. The following table shows the percentage of error correction cycles for different DISC speed. It is obvious that the percentage is higher when Disc speed is higher. As a result, it is very worthful to reduce the cycle consumed for error correction

| Blu-Ray DISC Speed | Cycles for 1 Cluster (Asuume 1 cycle = 10 ns) | Percentage of Error correction |
| --- | --- | --- |
| 1× | 956000 cycles | 41459/956000 = 4.33% |
| 4× | 239000 cycles | 41459/239000 = 17.35% |
| 8× | 119500 cycles | 41459/119500 = 34.69% |
| 14× | 68286 cycles | 41459/68286 = 60.71% |

SUMMARY

An exemplary embodiment of an error correction device comprises a first memory, a reed-solomon (RS) engine, a memory controller, a computing unit, and a second memory. The error correction device is used to correct a data group stored in the first memory. The RS engine receives a plurality of error correction codes and decodes an error sequence according to the error correction codes for modifying the data group. The memory controller executes a burst read operation to the first memory, and the first memory then outputs the data group. The computing unit receives the error sequence from the RS engine and the data group from the first memory and performs a logic operation for the error sequence and the data group to obtain the modified data group. The second memory is coupled to the computing unit and stores the modified data group. When the memory controller executes a write operation, the memory controller controls the first memory to receive and store the modified data group from the second memory.

An exemplary embodiment of an error correction device comprises a first memory, a reed-solomon (RS) engine, a memory controller, a computing unit, and a second memory. The error correction device is used to correct a data group stored in the second memory in advance. The RS engine receives a plurality of error correction codes and decodes an error sequence according to the error correction codes. The computing unit receives the error sequence from the RS engine and the data group from the second memory, performs a logic operation for the error sequence and the data group, and then outputs the modified data group to the second memory for storage. The memory controller executes a burst write operation to the DRAM, and the DRAM then receives the modified data group from the second memory for storage.

In some embodiments, the RS engine decodes the data group and determines the error location and value of the data group.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

Figure 1:
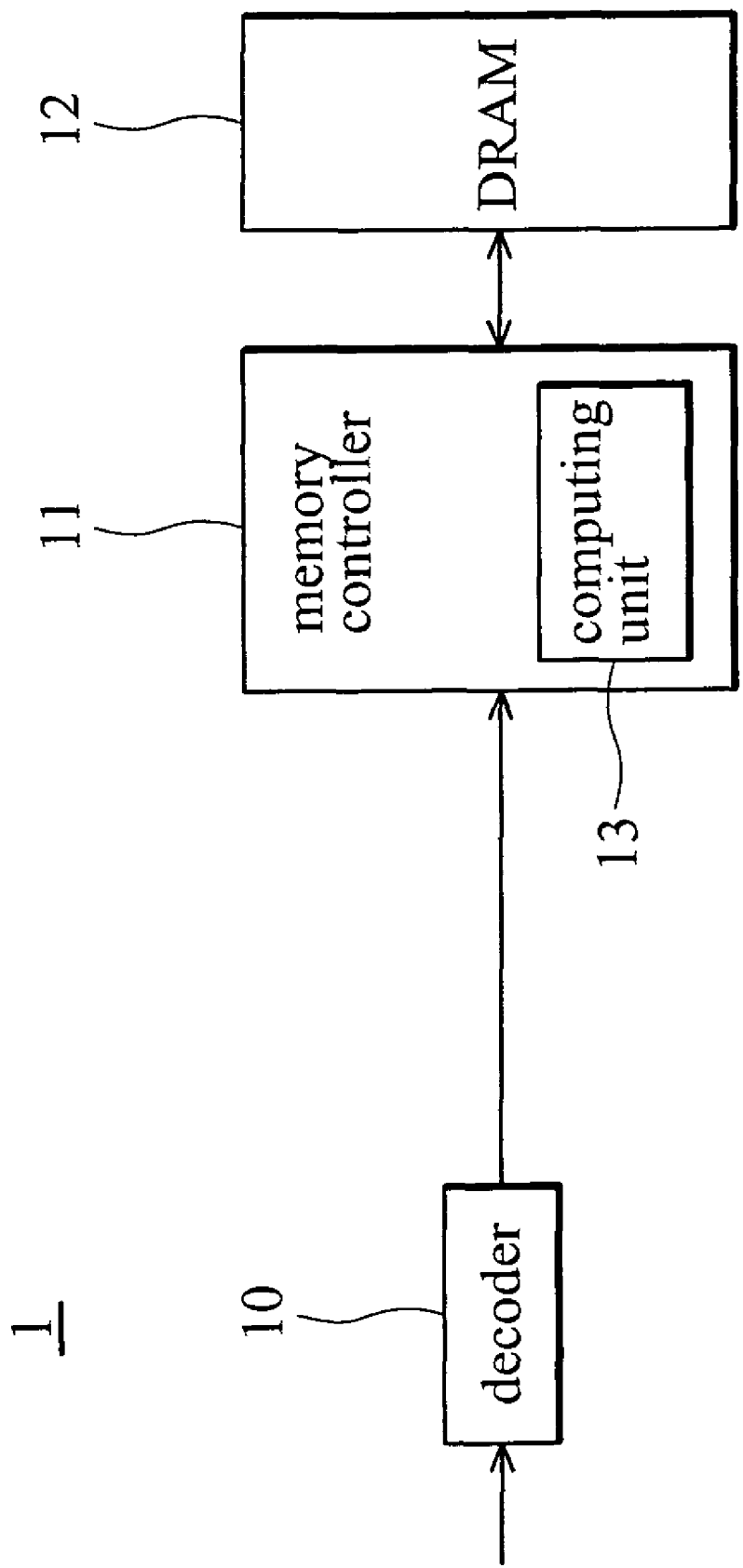
FIG. 1 shows a conventional scheme of an error correction device.
Figure 2:
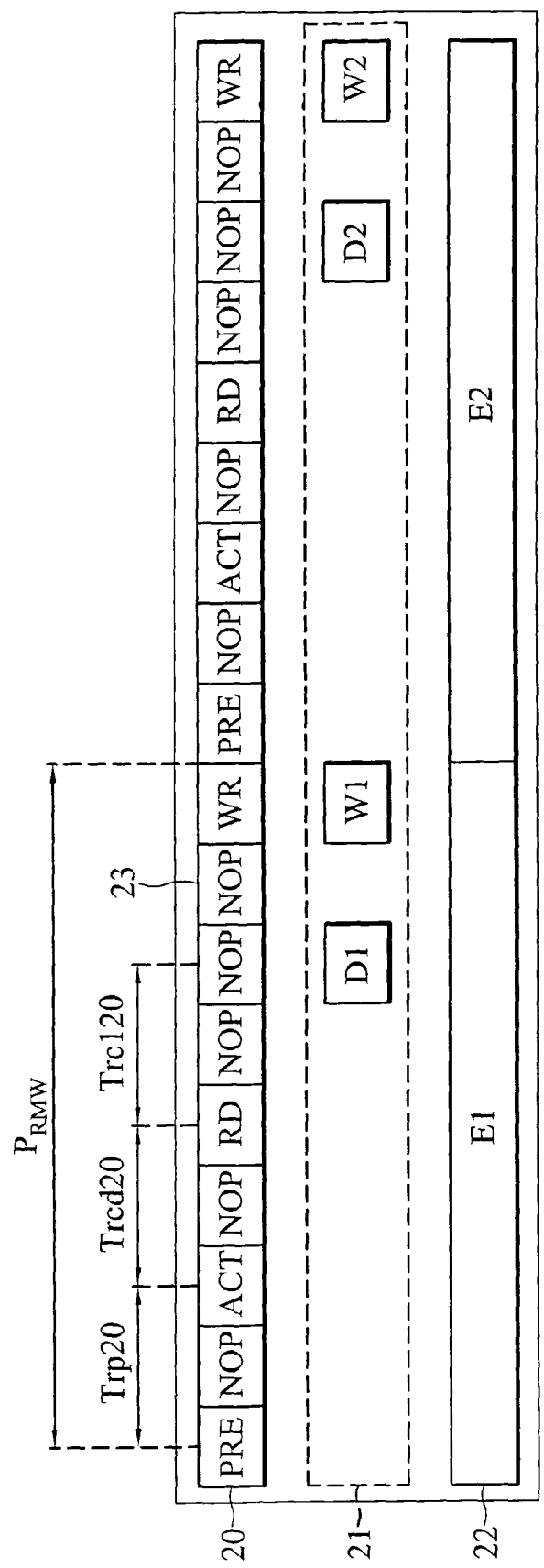
FIG. 2 depicts commands of the memory controller of FIG. 1 in RMW operations.
Figure 3:
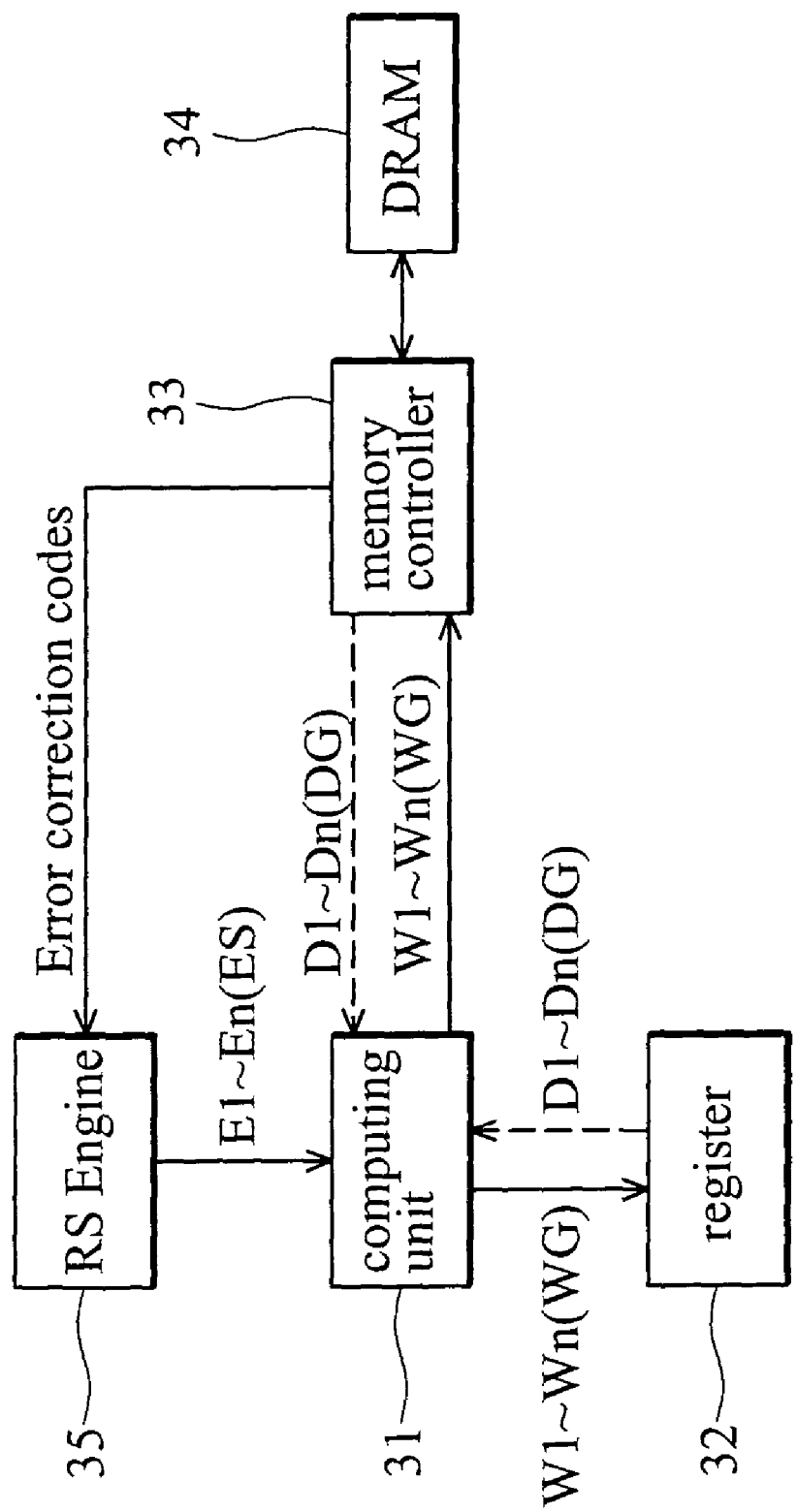
FIG. 3 depicts an embodiment of an error correction device.

Error correction devices are provided. In some embodiments, as shown in FIG. 3, an error correction device 3 comprises a computing unit 31, a register 32, a memory controller 33, a dynamic random access memory (DRAM) 34, and a reed-solomon (RS) engine 35. The DRAM 34 stores m data sets, and the length of each data set is one byte. The RS engine 35 checks the m data sets. In the embodiment of FIG. 3, the RS engine 35 determines that n data sets D1 to Dn among the m data sets are incorrect and calculates corresponding error values E1 to En, which compose an error sequence ES, according to error correction codes (ECCs). The data sets D1 to Dn are referred to a data group DG. In the error correction device 3 of FIG. 3, the register 32 can be a first-in first-out (FIFO) buffer or a synchronous dynamic random access memory (SDRAM).

Figure 4:
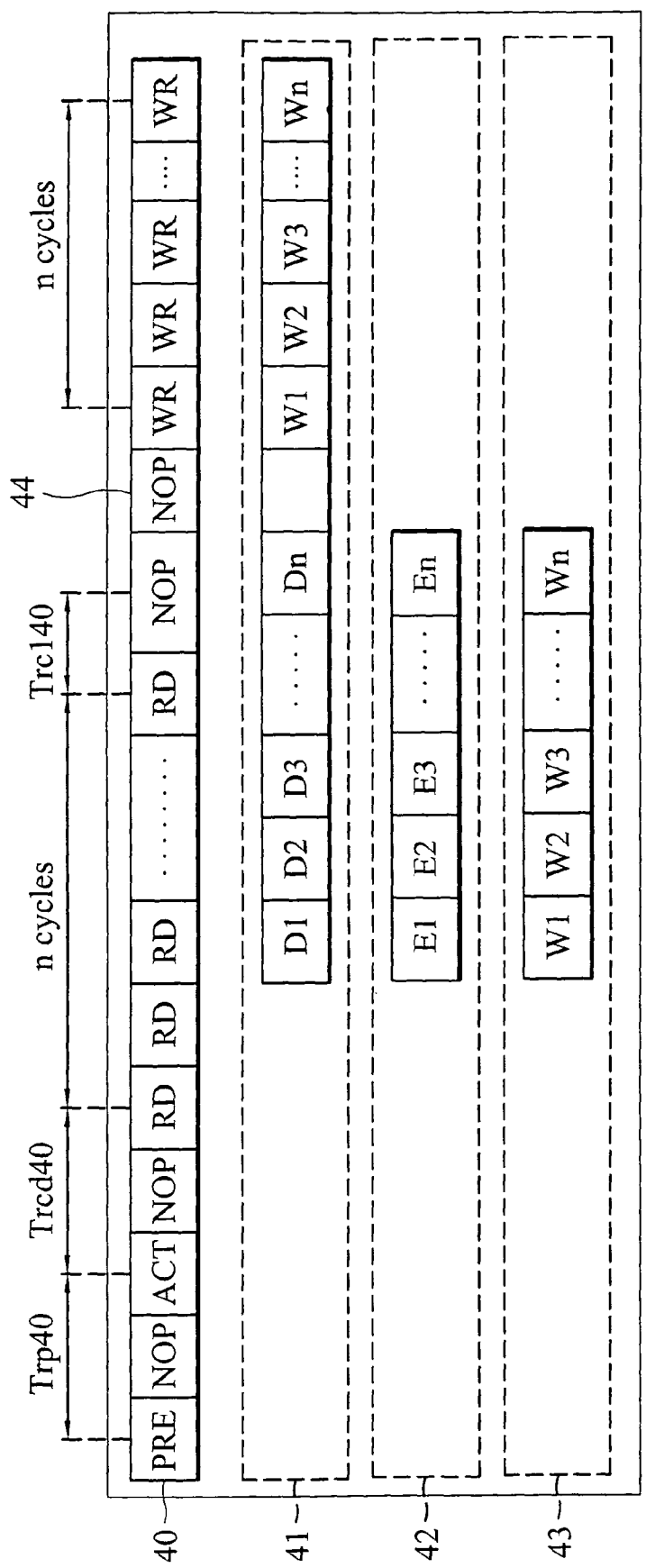
FIG. 4 depicts one example of commands of the memory controller of FIG. 3.

FIG. 4 depicts one example of commands of the memory controller 33, wherein the label "40" represents the commands of the memory controller 33, the label "41" represents reading/writing data sets on DRAM bus, the label "42" represents the error values E1 to En, and label "43" represents the data sets in the register 32. Referring to FIGS. 3 and 4. After the RS engine 35 determines that the data group DG is incorrect and calculates corresponding error sequence and location, the memory controller 33 sends a pre-charge command (PRE) and an active command (ACT) t9 the DRAM 34, so that addresses of the data group DG to be modified in the DRAM 34 are located. When the memory controller 33 executes a burst read operation to the DRAM 34, it sends read commands (RDs) to the DRAM 34, and the DRAM 34 outputs the data group DG to the computing unit 31 through the DRAM bus according the addresses, represented by the dotted line between the computing unit 31 and the memory controller 33. The computing unit 31 also receives the error sequence ES from the RS engine 35. The computing unit 31 performs a logic operation for the data group DG and the error sequence ES, thus the data group DG is modified with the error sequence ES. The modified data group WG is output from the computing unit 31 to the register 32 for storage. When the memory controller 33 executes a write operation to the DRAM 34, the memory controller 33 sends write commands (WRs) to the DRAM 34, and the modified data group WG is output to the DRAM 34 from the register 32 and restored in the corresponding addresses in the DRAM 34.

In the following description, some operations of the above devices are described in detail. Referring to FIGS. 3 and 4, the computing unit 31 receives the error values E1 to En of the error sequence ES from the RS engine 35. When the memory controller 33 executes a burst read operation to the DRAM 34 and sends n read commands (RDs) to the DRAM 34, the DRAM 34 outputs the data sets D1 to Dn of the data group DG to the computing unit 31 in order. The computing unit 31 performs a logic operation for the data sets D1 to Dn and the error values E1 to En to modify the data sets D1 to Dn and then obtains the modified data sets W1 to Wn of the modified data group WG. In this embodiment, the logic operation is an exclusive OR (XOR) operation represented by the equation Di XOR Ei=Wi, wherein $1 \leq i \leq n$, for example, D1 XOR E1=W1, D2 XOR E2=W2 etc. After obtaining the modified data sets W1 to Wn, the computing unit 31 outputs the modified data sets W1 to Wn to the register 32 for storage. When the memory controller 33 executes a write operation to the DRAM 34, the memory controller 33 sends n write commands (WRs) to the DRAM 34, and the modified data sets W1 to Wn are output to the DRAM 34 from the register 32 in order and restored in the corresponding addresses in the DRAM 34. In this embodiment, the memory controller 33 sends one pre-charge command (PRE), one active command (ACT), n read commands, and n write commands for n data sets to be modified.

In FIG. 4, the memory controller 33 sends no-operation commands (NOPs) between the pre-charge command (PRE) and the active command (ACT), between the active command (ACT) and the first read command (RD) among the read commands (RDs), and between the last read command (RD) among the read commands (RDs) and the first write command (WR) among the write commands (RDs). The no-operation command (NOP) 44 prevents DRAM bus connection. The label "Trp40" represents the delay from the pre-charge command (PRE) to the active command (ACT), the label "Trcd40" represents the delay from the active command (ACT) to the first read command (RD), the label "Trcl40" represents the delay from the last read command (RD) to the time when the data set D1 on the DRAM bus.

Referring to FIG. 4, when n data sets are modified, the error correction device 3 requires (Trp40+Trcd40+n(RD)+Tcl40+1(NOP 44)+n(WR)) cycles. It is assumed that each of the delays Trp40, Trcd40, and Trcl40 consumes 3 cycles, and the error correction device 3 is employed in a blue-ray disc BD. When a cluster of a blue-ray disc has 248*304 bytes, and the error rate thereof is 5%. The blue-ray disc will consume about 10579 cycles ((3+3+248*5%+3+1+248*5%)*304=~10579). This is equal to about 26% of 41459 cycles consumed by the conventional error correction device 1, thus the occupied bandwidth of a DRAM is reduced.

Figure 5:
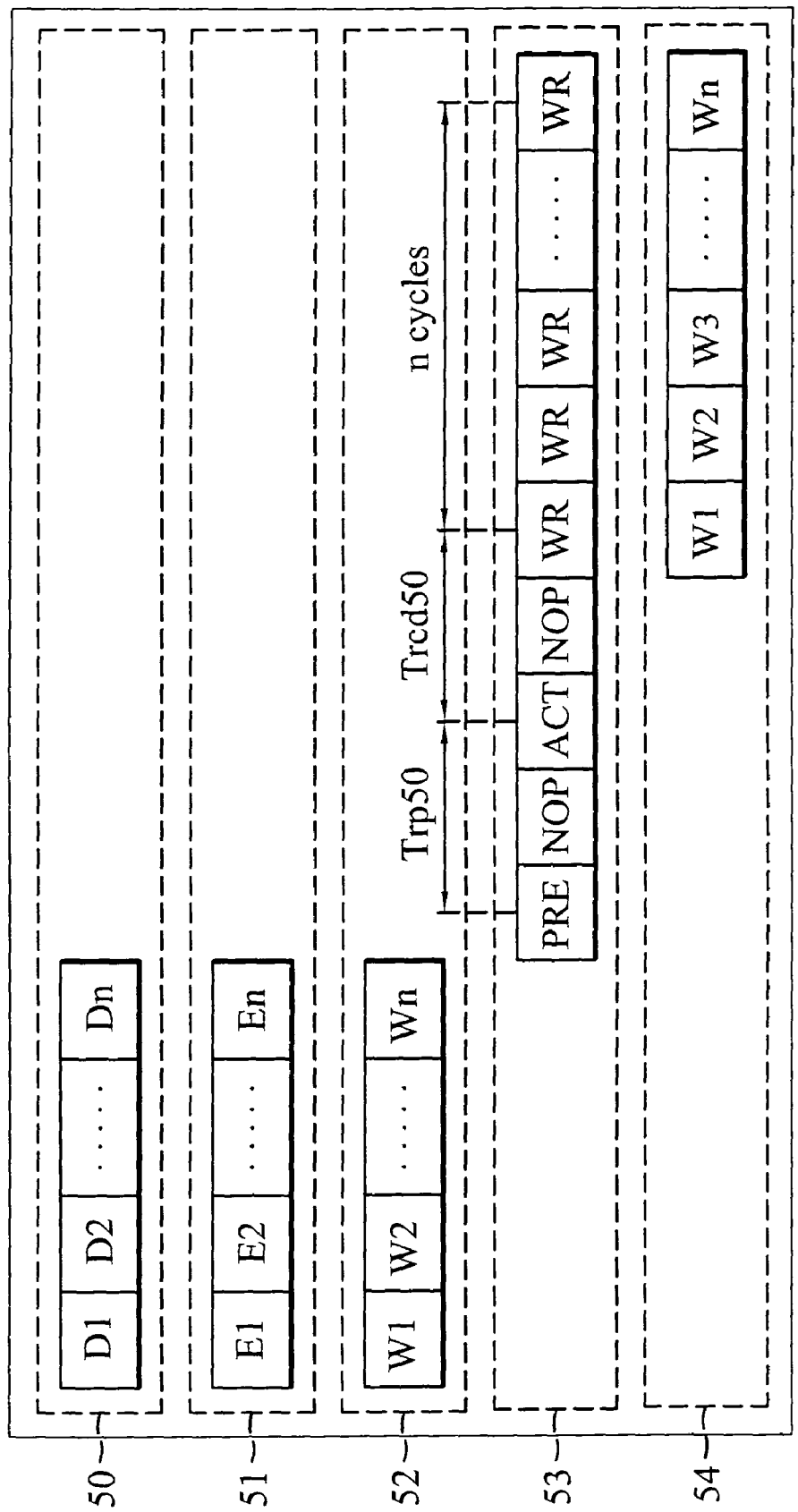
FIG. 5 depicts another example of commands of the memory controller of FIG. 3.

In some embodiments, when determining incorrect data sets D1 to Dn, the RS engine 35 stores the data sets D1 to Dn to the register 32. FIG. 5 depicts another example of commands of the memory controller 33, wherein the label "50" represents the data sets stored in the register 32 in advance, the label "51" represents the error values E1 to En, the label "52" represents the data sets in the register 32 after the correction, the label "53" represents the commands of the memory controller 33, and the label "53" represents reading/writing data sets on the DRAM bus.

Referring to FIGS. 3 and 5, the register 32 stores, the data sets D1 to Dn, labeled "50", in advance. The computing unit 31 receives the data sets D1 to Dn from the register 32 (represented by the dotted line between the computing unit 31 and the register 32) and the error values E1, to En from the RS engine 35. The computing unit 31 then performs a logic operation for the data sets D1 to Dn and the error values E1 to En to modify the data sets D1 to Dn and obtains the modified data sets W1 to Wn. The logic operation can be an exclusive OR operation (XOR). After getting the modified data sets W1 to Wn, the computing unit 31 outputs the modified data sets W1 to Wn to the register 32. At this time, the register 32 stores the modified data sets W1 to Wn, instead of the data sets D1 to Dn. The memory controller 33 the sends a pre-charge command (PRE) and an active command (ACT) to the DRAM 34, thus addresses of the data sets D1 to Dn to be modified in the DRAM 34 are located. When the memory controller 33 executes a burst write operation to the DRAM 34, it sends n write commands (WRs) to the DRAM 34. The modified data sets Wi to Wn are output to the DRAM 34 from the register 32 in order and restored in the corresponding addresses in the DRAM 34. In the embodiment of FIG. 5, the memory controller 33 sends one pre-charge command (PRE), one active command (ACT), and n write commands for n data sets to be modified.

In FIG. 5, the label "Trp50" represents the delay from the pre-charge command (PRE) to the active command (ACT), and the label "Trcd50" represents the delay from the active command (ACT) to the first write command (WR). Referring FIGS. 3 and 5, when n data sets are modified, the error correction device 3 needs (Trp50+Trcd50+n(write command)) cycles. It is assumed that each of the delays Trp50 and Trcd50 consumes 3 cycles, and the error correction device 3 is employed in a blue-ray disc BD. When a cluster of a blue-ray disc, has 248*304 bytes, and the error rate thereof is 5%, the blue-ray disc will consume about 5594 cycles ((3+3+248*5%)*304=~5594). It is equal to about 12% of the 41459 cycles consumed by the conventional error correction device 1. Thus, the occupied bandwidth of a DRAM is more reduced.

Figure 6:
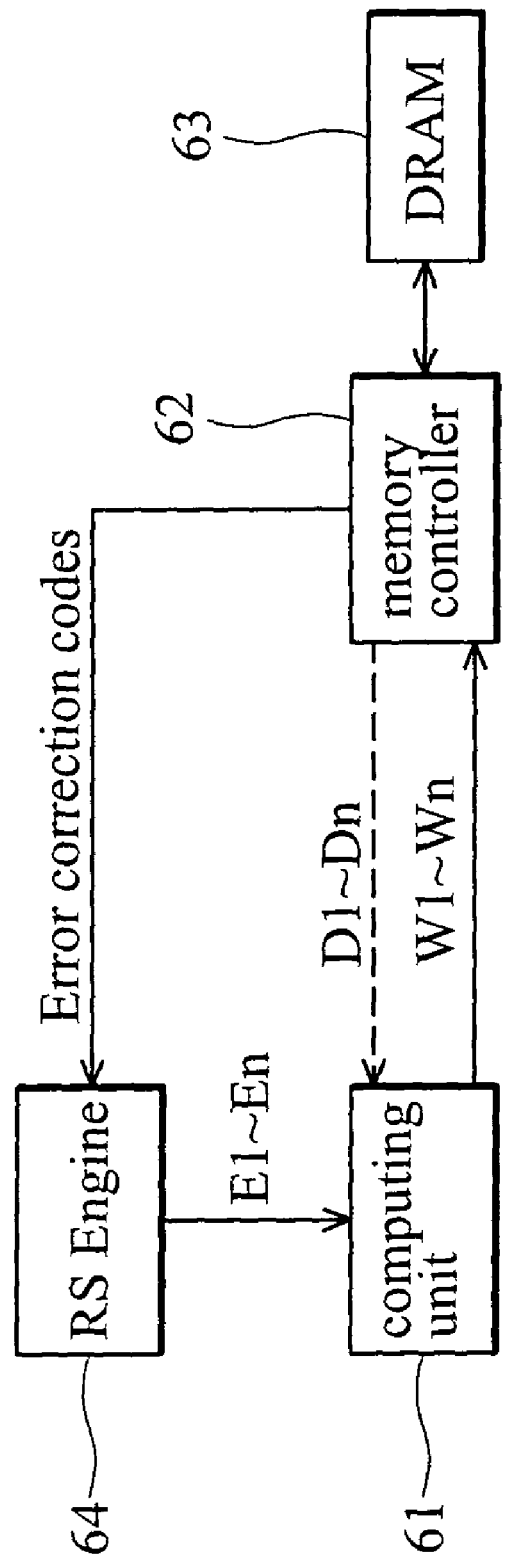
FIG. 6 depicts an embodiment of an error correction device.

In some embodiments, as shown in FIG. 6, an error correction device 6 comprises a computing unit 61, a memory controller 62, a dynamic random access memory (DRAM) 63, and a reed-solomon (RS) engine 64. The DRAM 63 stores m data sets, and the length of each data set is one byte. The RS engine 64 checks the m data sets. In the embodiment of FIG. 6, the RS engine 64 determines that n data sets D1 to Dn among the m data sets are incorrect and calculates corresponding error values E1 to En.

Figure 7A:
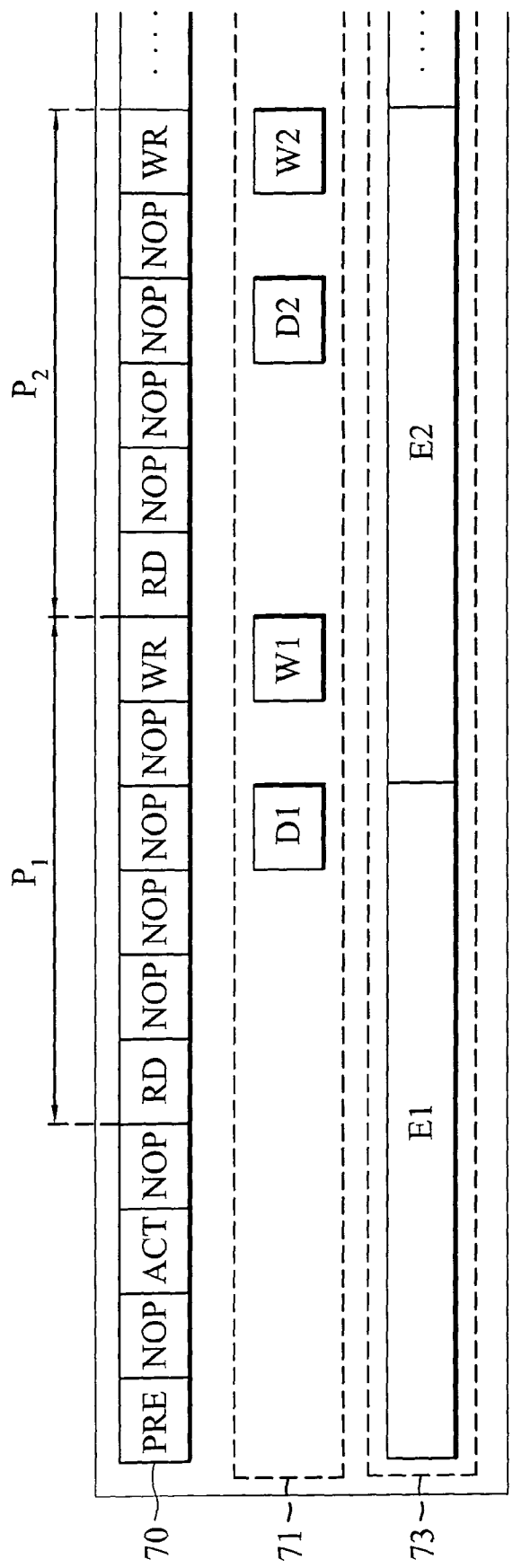
FIGS. 7a and 7b depicts another example of commands of the memory controller of FIG. 6.
Figure 7B:
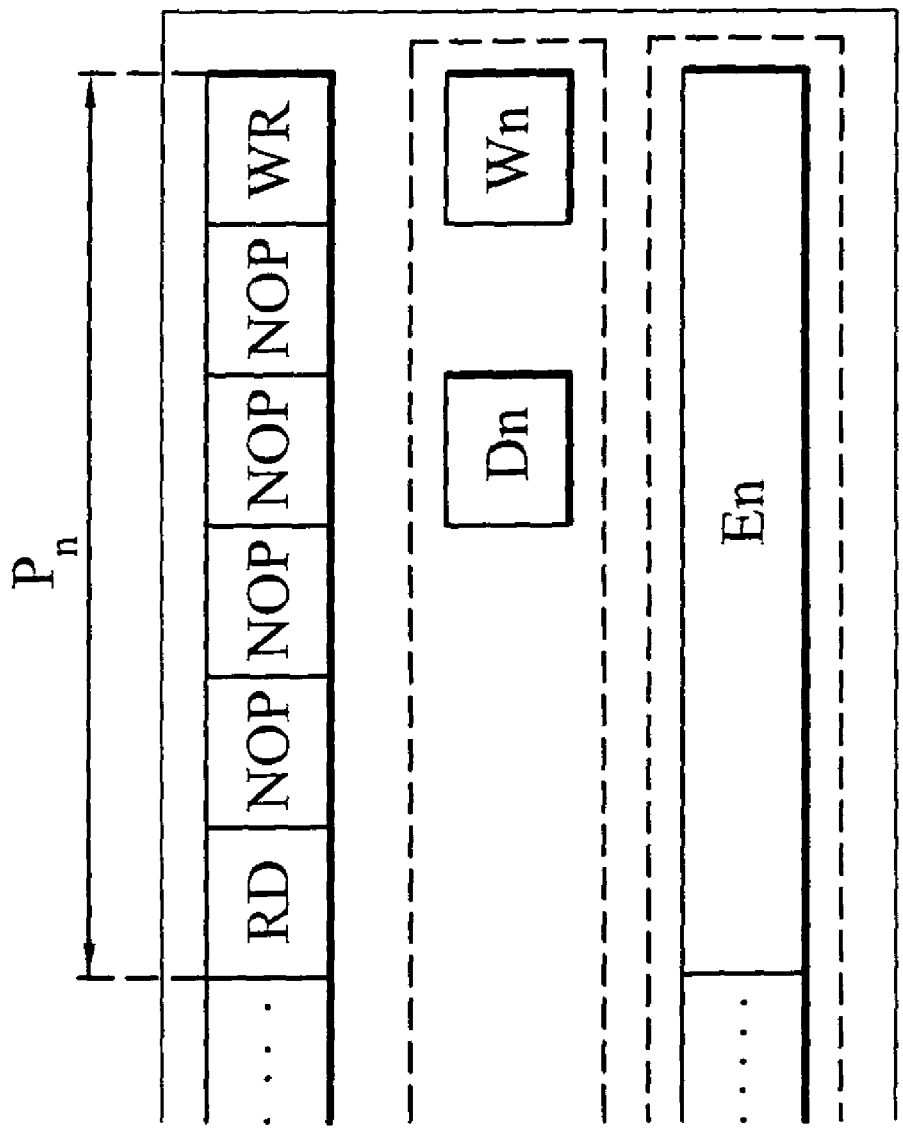

FIGS. 7a and 7b depict one example of commands of the memory controller 62, wherein the label "70" represents the commands of the memory controller 62, the label "71" represents reading/writing data on a DRAM bus, and the label "72" represents the error values E1 to En.

Referring to FIGS. 6, 7a and 7b, the computing unit 61 receives the error values E1 to En from the RS engine 64. To modify the n data sets D1 to Dn, the memory controller 62 executes a burst read-modify-write (RMW) operation to the DRAM 63. The memory controller 62 sends a pre-charge command (PRE) and an active command (ACT) to the DRAM 63, so that addresses of the data sets D1 to Dn to be modified in the DRAM 63 are located. The memory controller 62 then sends first read command (RD) to the DRAM 63. The DRAM 63 outputs the data set D1 to the computing unit 61, represented by the dotted line between the computing unit 61 and the memory controller 63. The computing unit 61 performs a logic operation for the data set D1 and the corresponding error value E1 to modify the data set D1 and then obtains the modified data set W1. In this embodiment, the logic operation is an exclusive OR (XOR) operation represented by the equation D1 XOR Ei=Wi, wherein $1 \leq i \leq n$, for example, D1 XOR E1=W1, D2 XOR E2=W2 etc. When the memory controller 62 sends a first write command (WR) to the DRAM 63, the modified data set W1 is transmitted to the DRAM 63 from the computing unit 61 and restored in the corresponding address in the DRAM 63. The duration from the first read command (RD) to the first write command (WR) is referred to a first sub-RMW operation period P1.

The memory controller 62 then sends a second read command (RD) to the DRAM 63. The DRAM 63 outputs the data set D2 to the computing unit 61. The computing unit 61 performs a logic operation for the data set D2 and the corresponding error value E2 and then obtains the modified data set W2. When the memory controller 62 sends a second write command (WR) to the DRAM 63, the modified data set W2 is transmitted to the DRAM 63 from the computing unit 61 and restored in the corresponding address in the DRAM 63. The duration from the second read command (RD) to the second write command (WR) is referred to a second sub-RMW operation period P2. For one burst RMW operation, the above actions are repeated for modifying data sets D1 to Dn in n sub-RMW operation periods. In the i-th sub-RMW operation period Pi, the computing unit 61 receives i-th data set Di from the DRAM 63, performs a logic operation for the i-th data set D1 and the i-th error value Ei to obtain the i-th modified data set Wi, and outputs the i-th modified data set to the DRAM 63 for storage. Thus, in this embodiment, the memory controller 62 only sends one pre-charge command (PRE), one active command (ACT), n read commands, and n write commands for n data sets to be modified.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An error correction device comprising:
a first memory storing a plurality of data sets;
a reed-solomon (RS) engine receiving a plurality of error correction codes and determining an error sequence according to the error correction codes for modifying an incorrect data group among the plurality of data sets;
a memory controller executing a burst read operation to the first memory to control the first memory to output the data group for modifying;
a computing unit receiving the error sequence from the RS engine and the data group from the first memory and performing a logic operation for the error sequence and the data group to obtain the modified data group; and
a second memory coupled to the computing unit and storing the modified data group;
wherein the memory controller executes a write operation to control the first memory to receive and store the modified data group from the second memory.

2. The error correction device as claimed in claim 1, wherein the data group comprises a plurality of bytes of data.

3. The error correction device as claimed in claim 1, wherein the second memory is a first-in, first-out buffer.

4. The error correction device as claimed in claim 1, wherein the first memory is a synchronous dynamic random access memory (SDRAM).

5. The error correction device as claimed in claim 1, wherein the logic operation is an exclusive OR operation (XOR).

6. The error correction device as claimed in claim 1, wherein the memory controller sends one pre-charge command and one active command to the first memory before the burst read operation, and when the memory controller executes the burst read operation, the memory controller sends a plurality of read commands to the first memory.

7. An error correction device, comprising:
a reed-solomon (RS) engine receiving a plurality of error correction codes and determining an error sequence according to the error correction codes;
a first memory storing a plurality of data sets;
a second memory storing an incorrect data group among the plurality of data sets;
a computing unit receiving the error sequence from the RS engine and the data group from the second memory, performing a logic operation for the error sequence and the data group, and then outputting the modified data group to the second memory for storage; and
a memory controller executing a burst write operation on the first memory to control the first memory to receive the modified data group from the second memory for storage.

8. The error correction device as claimed in claim 7, wherein the data group comprises a plurality of bytes of data.

9. The error correction device as claimed in claim 7, wherein the second memory is a first-in, first-out buffer.

10. The error correction device as claimed in claim 7, wherein the first memory is a synchronous dynamic random access memory (SDRAM).

11. The error correction device as claimed in claim 7, wherein the logic operation is an exclusive OR operation (XOR).

12. An error correction device for correcting n data sets, comprising:
a memory storing the n data sets;
a reed-solomon (RS) engine receiving a plurality of error correction codes and determining n error values according to the error correction codes;
a memory controller executing a burst read-modify-write (RMW) operation to the memory for modifying the n data sets in n predetermined periods; and
a computing unit coupled to the RS engine and the memory controller;
wherein when the memory controller executes the burst RMW operation to the memory, in the i-th predetermined period among the n predetermined periods, the computing unit receives the i-th data set from the memory, performs a logic operation for the i-th data set and the i-th error value to obtain the i-th modified data set, and outputs the i-th modified data set to the memory for storage, $1 \leq i \leq n$.

13. The error correction device as claimed in claim 12, wherein the data group comprises a plurality of bytes of data.

14. The error correction device as claimed in claim 12, wherein the logic operation is an exclusive OR operation (XOR).

15. A method for correcting a plurality of data sets stored in a first memory, comprising:
determining that a data group among the plurality of data sets stored in the first memory is incorrect;
receiving a plurality of error correction codes;
determining an error sequence according to the error correction codes
executing a burst read operation to the first memory to control the first memory to output the data group for modifying;
performing a logic operation for the error sequence and the data group to get the modified data group;
storing the modified data group in a second memory; and
executing a write operation to control the first memory to store the modified data group from the second memory.

16. The method as claimed in claim 15, wherein the data group comprises a plurality of bytes of data.

17. The method as claimed in claim 15, wherein the logic operation is an exclusive OR operation (XOR).

18. A method for correcting a plurality of data sets stored in a first memory, comprising:
determining that a data group among the plurality of data sets stored in the first memory is incorrect;
storing the data group in a second memory
receiving a plurality of error correction codes;
determining an error sequence according to the error correction codes;
reading the data group from the second memory;
performing a logic operation for the error sequence and the data group from second memory to get the modified data group;
outputting the modified data group to the second memory for storage; and
executing a burst write operation to the first memory to control the first memory to store the modified data group from the second memory.

19. The method as claimed in claim 18, wherein the data group comprises a plurality of bytes of data.

20. The method as claimed in claim 18, wherein the logic operation is an exclusive OR operation (XOR).

21. The method as claimed in claim 18 further comprising storing the modified data group in the second memory and outputting the modified data group to the first memory.

22. A method for correcting n data sets stored in a memory, comprising:
receiving a plurality of error correction codes;
determining n error values according to the error correction codes;
executing a burst read-modify-write (RMW) operation to the memory to output the n data sets in n predetermined periods for modifying; and
performing a logic operation for the i-th data set and the i-th error value to obtain the i-th modified data set and storing the i-th modified data set to the memory in the i-th predetermined period among the n predetermined periods, wherein $1 \leq i \leq n$.

23. The method as claimed in claim 22, wherein the data group comprises a plurality of bytes of data.

24. The method as claimed in claim 22, wherein the logic operation is an exclusive OR operation (XOR).

* * * * *